United States Patent [19]

Bernhardt

[11] Patent Number: 5,098,526
[45] Date of Patent: Mar. 24, 1992

[54] PROCESS FOR PREPARATION OF A SEED LAYER FOR SELECTIVE METAL DEPOSITION

[75] Inventor: Anthony F. Bernhardt, Berkeley, Calif.

[73] Assignee: The United States of America as represented by the United States Department of Energy, Washington, D.C.

[21] Appl. No.: 682,506

[22] Filed: Apr. 8, 1991

[51] Int. Cl.⁵ .................................... C25D 5/02
[52] U.S. Cl. .................................... 205/125
[58] Field of Search .......................... 204/15

[56] References Cited

U.S. PATENT DOCUMENTS 3,506,545 4/1970 Garwin .................................... 204/15
4,217,183 8/1980 Melcher .................................... 204/15

Primary Examiner—T. M. Tufariello
Attorney, Agent, or Firm—L. E. Carnahan; Henry P. Sartorio; William R. Moser

[57] ABSTRACT

Disclosed is a process for selective metal deposition comprising of the steps of:
a. formation of an initial surface on a substrate, said initial surface being comprised of at least two layers of which the uppermost is inert,
b. exposing the surface to a source of heat in pre-determined places wherein surface activation is desired, and
c. deposition of metal on activated portions of said surface.

17 Claims, 3 Drawing Sheets

PROCESS FOR PREPARATION OF A SEED LAYER FOR SELECTIVE METAL DEPOSITION

The U.S. Government has rights in this invention pursuant to Contract NO. W-7405-ENG-48 between the U.S. Department of Energy and the University of California for the operation of Lawrence Livermore National Laboratory.

BACKGROUND OF THE INVENTION

The present invention relates to a process for preparation of a seed layer for selective metal deposition on a substrate. More particularly, it relates to a process utilizing a laser for preparation of a seed layer for selective metal deposition.

Lasers and other directed energy sources such as ion and electron beams have been used to deposit and etch materials on surfaces. They have also been used to cause thin layers of materials to mix, alloy or react for various purposes. For example, U.S. Pat. No. 4,574,095 discloses the use of an excimer laser to deposit palladium onto a surface from a liquid precursor for the purpose of speeding a subsequent electroless plating process. Similarly, U.S. Pat. No. 4,701,347 teaches a method of laser depositing material from a metallorganic vapor which catalyses the subsequent deposition of metal on the laser-treated surface.

U.S. Pat. No. 4,555,301 discloses the use of a laser to cause the melting of a layer of nickel (Ni) on crystalline silicon (Si) to form substantially monocrystalline nickel silicide (NiSi2). Still another example, as disclosed in U.S. Pat. No. 4,495,255, is the use of a laser to cause alloying of gold (Au) with nickel (Ni) to form a good electrical connector. In addition, a pulsed laser is described in U.S. Pat. No. 4,877,644 which can be used to ablate a polymer masking layer off an underlying metal seed layer to permit deposition on that exposed metal.

The present invention relates to creation of plated metal interconnects from the surface of an integrated circuit (IC) chip, down the side of the chip, to contacts on the underlying silicon circuit board. Conductors are to be formed on the vertical sides of the chip, as well as on horizontal surfaces. Liquid precursors of a seed layer such as are used in U.S. Pat. No. 4,574,095 are unsatisfactory since they do not adequately cover the vertical surfaces on top edges. Liquid polymer precursors used in U.S. Pat. No. 4,877,644 are unsatisfactory of the same reason. Direct laser deposition of the entire conductor from the vapor phase has the disadvantage that deposition is too slow to be practical.

U.S. Pat. Nos. 4,555,301 and 4,495,255 describe alloying two or more materials, however, the laser step was not followed by a further deposition step.

U.S. Pat. No. 4,348,263 to Draper et al, discloses laser irradiation of a surface followed by electroplating, but the laser step does not form the alloy nor does it activate an otherwise inert surface for electroplating. The initial surface is active and the laser is only used to improve the surface morphology.

It would be desirable in the art to provide a process for activating a surface layer in a predetermined pattern suchh that metal could be selectively deposited thereon, and electronic circuits or interconnects formed. This invention is concerned with such a process.

SUMMARY OF THE INVENTION

It is an object of this invention to provide for preparation of a seed layer on a substrate, upon which a selective metal may be deposited.

It is a further object of this invention to provide a laser based process for preparation of an activated seed layer upon which a selective metal may be deposited.

It is a further object of this invention to provide an improved process for selective metal deposition on a substrate.

The foregoing and other objects of the invention will be apparent from the description and drawings to follow.

The invention encompasses the use of a laser or other directed source of energy to heat the surface area exposed to the energy source and convert it from an inactive state to an active one for the purposes of subsequent selective deposition of metal on the surface. In particular, a surface composed of an inert top layer and a metallic lower layer are caused to mix or alloy by the energy source, preferably a laser, to form a single layer which will allow a good electrical conductor to be electroplated onto it.

The invention, therefore, is a process for preparation of a seed layer upon which a metal can be selectively deposited which comprises:

a. formation of an initial surface comprised of at least two layers of material of which the uppermost is insert, b. exposing surface to a source of heat in pre-determined places where surface activation is desired wherein said heat is applied at an energy level sufficient to form an alloy or mixture of and to activate said initial surface, and c. depositing metal on activated portions of said surface.

IN THE DRAWINGS

DETAILED DESCRIPTION OF THE INVENTION

Figure 2A:
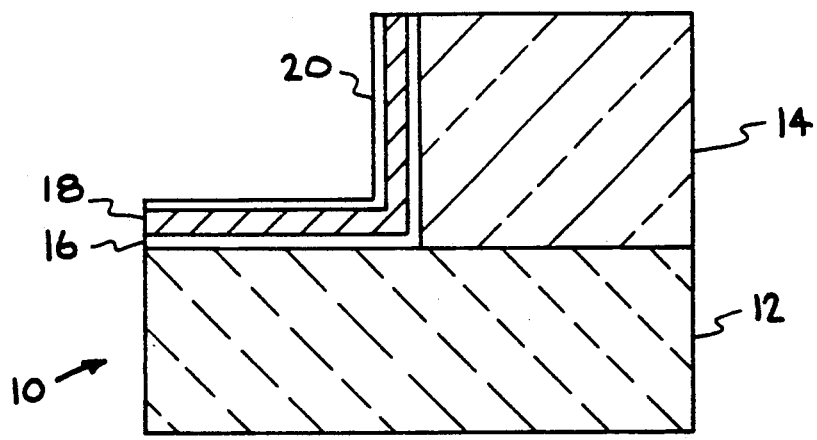
FIG. 2 is a cross-sectional view of a portion of a semiconductor before and after being subjected to the process of the invention.

In carrying out the process of the invention (FIG. 2), a substrate 10 is first selected upon which it is desired to selectively deposit metal. Normally this will be a circuit board 12 or computer chip 14 or both. The substrate 10 is then covered with an adhesion layer 16, preferably a mixture of titanium (30%) and tungsten (70%). The titanium-tungsten (Ti-W) layer serves to promote adhesion between the metal and the silicon dioxide below it. Due to the refractory nature of this adhesion metal, it is preferred to pure titanium or chromium which are also commonly used for this purpose. In particular, it is found that this adhesion layer does not alloy or mix with the other materials during the process and therefore retains its integrity as an adhesion layer. After the adhesion layer 16 is applied a second metal layer 18 preferably gold (Au), is applied to the surface of the adhesion layer 16. The metal layer(s) should be thick enough to allow sufficient current to flow to all parts of the sample where electroplating occurs without significant drop in the voltage. Preferably, 4" diameter silicon wafers are used and 2000A of gold suffices. Much greater thicknesses only make the ultimate removal of the unplated structure more time consuming.

A further amorphous silicon insulator layer 20 is then applied to the surface of the second metal layer 18. At this stage (FIG. 2(a)), the coated substrate in inactive. That is, metal cannot be electroplated on top of the top surface silicon insulator layer 20 because it will not electrically conduct. Ideally, this top layer is applied as thin as posssible, consistent with its function of preventing plating on unirradiated areas.

Figure 2B:
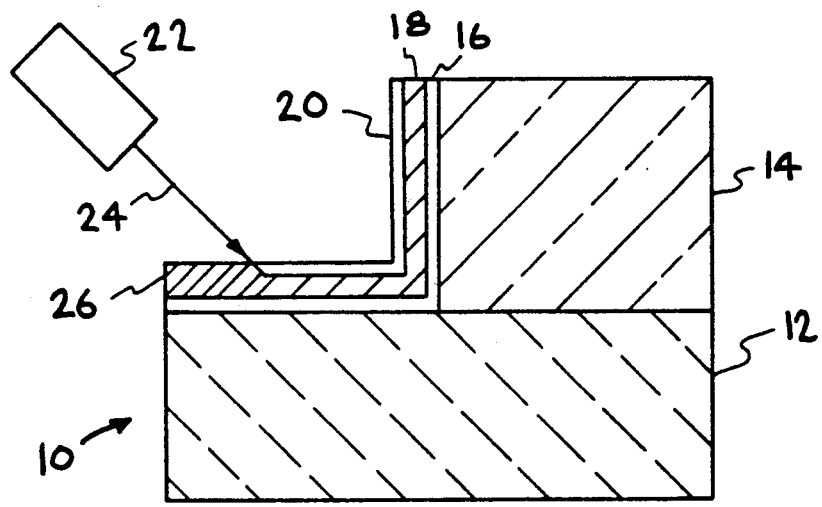
Figure 2C:
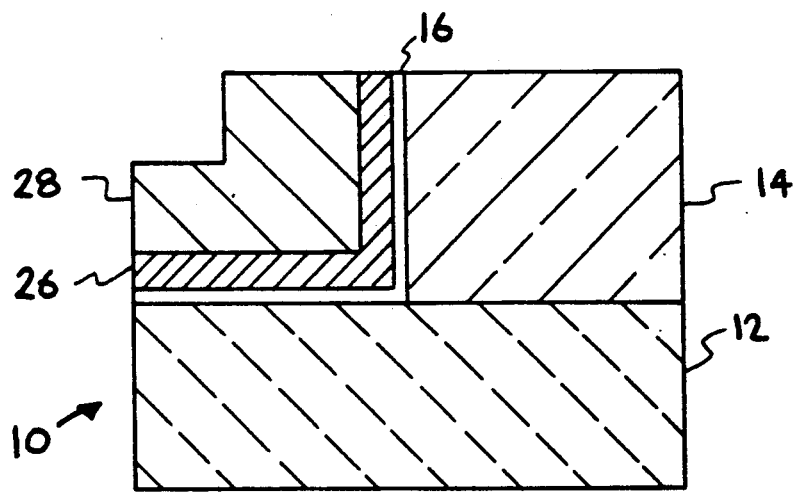

Thereafter the inactive component 20, is irradiated with a laser 22 having a beam 24 being emitted therefrom (FIG. 2(b)). The direction of laser motion is indicated in FIG. 2(b) by an arrow. The preferred laser 22 for this purpose is a argon ion laser which is operated so that the beam 24 heats and melts the topmost inert layer 20, and underlying second metal layer 18, sufficient to cause intermixing of the components of the two layers to form an alloy or mixture 26 and thereby activate that portion of the layers 18 and 20 underlying the laser beam 24. The activation enables a subsequent plating metal 28, preferably copper (Cu), to be applied to the alloy 26 (FIG. 2(c)). It will bond to that area which has been activated by the laser.

In this manner, thick low resistance metallic lines and other structures can be plated to the coated substrate. It will have the circuit configuration of the activated alloy component 26 of the device.

Figure 1:
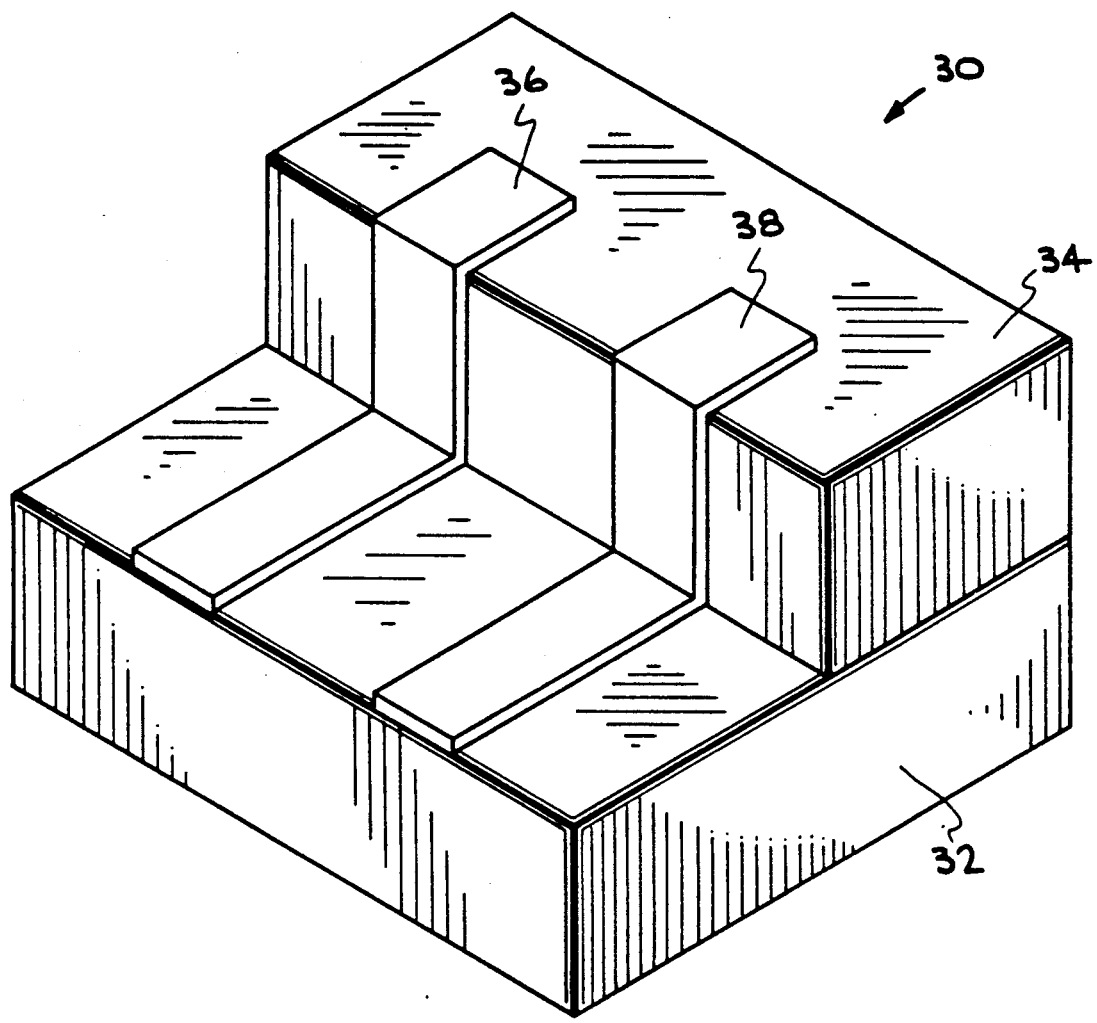
FIG. 1 is a highly magnified perspective view of a typical semiconductor prepared in accordance with the process of this invention.

A typical integrated circuit component 30 which can be produced in accordance with the method of the invention is shown schematically in FIG. 1. The circuit 30 comprises a substrate 30 upon which is positioned an integrated circuit chip 34 containing electronic circuits, not shown. A plurality of metallic interconnects 36 and 38 connect the integrated circuit chip 34 with other chips or buss lines, not shown. This component can be used in computers and other electronic devices.

While the preferred source of heat for activation of the surface layer is an argon ion laser, other sources can also be used such as pulsed eximer lasers and conventional flash lamps. If a flash lamp or excimer laser is to be used, it is necessary to place a mask over the surface layer whcih will allow exposure only in those areas of the surface layer in which activation is desired.

This invention will be more fully understood by reference to the specific examples which follow, which are intended to be illustrative of the invention, but not limiting thereof.

EXAMPLE 1

A series of 4" diameter silicon wafers were initially coated with silicon dioxide to simulate typical substrates prior to application of the seed layer structure. They were then coated with an adhesion coat, various thickness metal gold coats, and various thickness insulating amorphous-silicon coats.

After the insulating coat was applied, the wafers were subjected to an argon ion laser beam of power sufficient to cause the topmost insulating coat to mix with or be dissolved in the metal subcoat, thereby activating the seed layer. Thereafter the wafer was electroplated with copper. The copper plated only onto the activated material in the pattern created by the laser, thus forming an electronic circuit on the surface of the wafer.

The amorphous silicon renders the surface inactive to electroplating by virtue of the fact that it is an electrical insulator. The amorphous silicon is also a good absorber of the laser light. Thus, when exposed to the laser, the surface heats. When the surface becomes sufficiently hot, the layers mix. In this case, it is probable that the surface melts, but heating may also causing mixing by solid state diffusion. In other materials the heating may cause chemical reaction. When the laser exposure ceases, the surface cools rapidly, and tiny, dispersed silicon islands form in the solidifying gold matrix. The surface is now electrically conducting and can be electroplated easily, while areas not exposed to the laser continue to be insulating and will not plate. During the heating and cooling process the adhesion layer, being refractory, is substantially unaffected and retains its functionality. It is a further property of this layer that the molten gold-silicon wets it. Without this property, the molten metal tends to form beads and bands, leaving parts of the irradiated surface bare and inactive.

The preferred embodiment purposely does not use thicknesses of Au and silicon (Si) which approach eutectic composition (20 atomic % Si). Relatively large silicon fractions serve to provide superior light absorption, to increase protection against plating in unirradiated areas (e.g., because of pinholes), to prevent dewetting, and to increase the process margin (the range of laser fluence which can be used).

Figure 3:
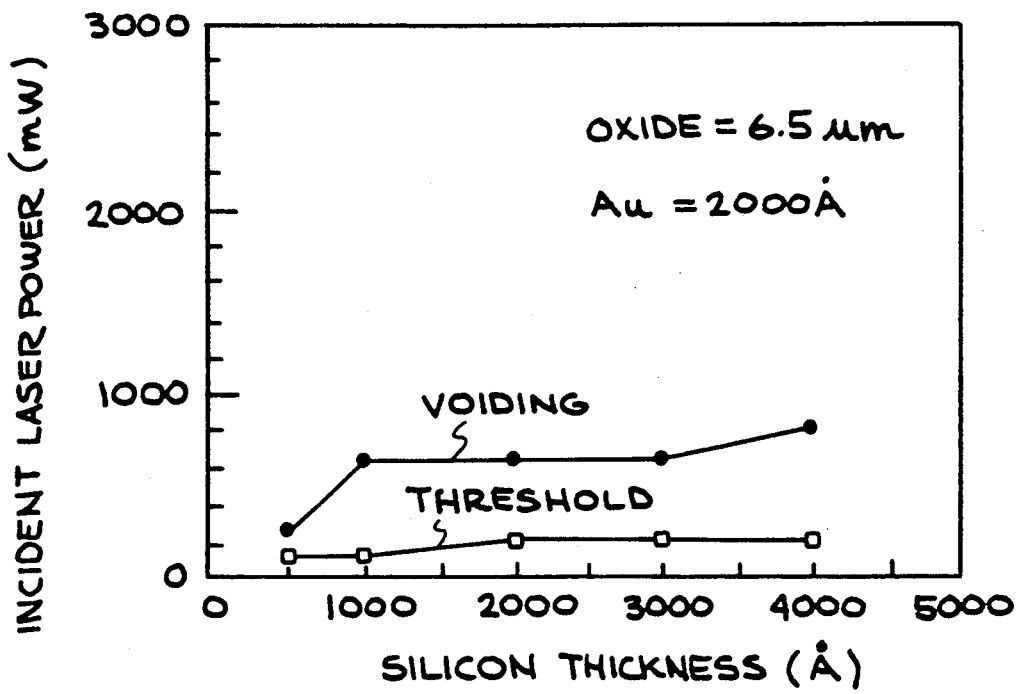
FIG. 3 is a graph showing the operative range of a laser power as a function of thickness of the silicon layer.
Figure 4:
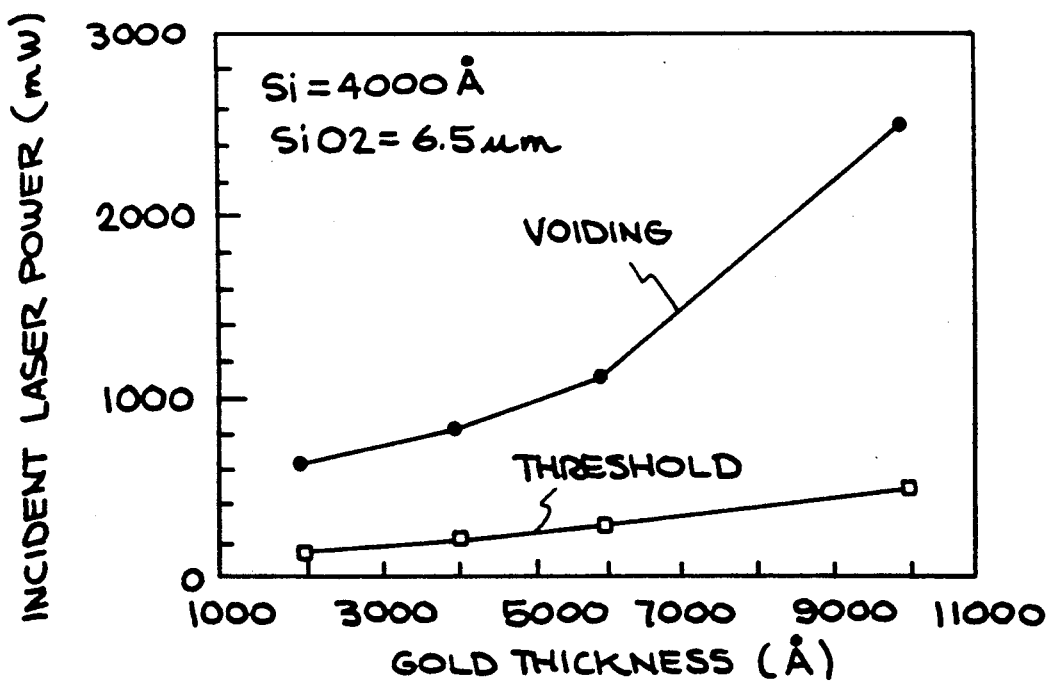
FIG. 4 is a graph showing the operative range of laser power as a function of thickness of the gold layer.

The attached graphs, FIGS. 3 and 4, summarize a series of tests which show laser powers which can be used with various material thicknesses. In FIG. 3 the thickness of the gold metal layer is always 2000 A and the Ti-W adhesion layer is approximately 400 A thick. The substrate consists of 6.5 $\mu$m of silicon dioxide on a 4" diameter silicon wafer of nominal thickness 525 $\mu$m. In FIG. 4 the silicon insulator layer thickness is always 4000 A and the Ti-W adhesion layer thickness is 400 A. The substrate consists of 6.5 $\mu$m of silicon dioxide on a 4" diameter silicon wafer of nominal thickness 525 $\mu$m. One of the very desirable properties of this structure is the extremely wide range (more than a factor of two) of lasers powers which can be used with various material thicknesses. Such wide margins make the process practical.

In the case of both silicon and titanium (see example 2 below) used as an insulating coat, a thin native oxide forms on the surface when the structure is exposed to air. This does not interfere with the laser processing, but it is sometimes advantageous to remove this oxide prior to electroplating using a hydrogen fluoride etchant containing vapor or liquid. The laser processing can be conducted in air, as well as in inert gas ambient. The HF treatment also removed the oxide so-formed, permitting successful electroplating of the laser-treated surface.

EXAMPLE 2

A series of silicon wafers were coated with an adhesion layer of Ti-W, followed by a layer of 2000 A of copper, then a 400 A layer of titanium. The titanium is itself a conductor, but it forms a strong oxide which prevents electroplating on areas which have not been exposed to the laser. In effect, then, the seed layer consists of four layers: Ti-W adhesion, copper metal, titanium metal and titanium dioxide insulator. The laser processing causes the titanium to dissolve in the copper, and the oxide layer is no longer present to prevent plating. The disadvantage with titanium structures is that the titanium is very reflective, so that much more laser power is required to initiate the process compared to silicon structures.

The foregoing description of preferred embodiments of the invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention in various embodiments and with various modifications, as are suited to the particular use contemplated. It is intended that the scope of the invention be defined by the claims appended thereto.

I claim:

1. A process for selective metal deposition comprising of the steps of:
    a. formation of an initial surface on a substrate, said initial surface being comprised of at least two layers, an upper layer and a lower layer, said upper layer comprising an electrical insulator and said lower layer comprising a metal,
    b. exposing the surface to a laser beam of sufficient energy to cause melting and intermixing of said upper and lower layers, and to activate said surface in pre-determined places where surface activation is desired,
    c. cooling and solidifying said surface, and
    d. depositing metal on activated portions of said surface.

2. The process of claim 1 wherein the heat source of step 2 is an argon ion laser.

3. The process of claim 1 wherein deposition of metal occurs by electroplating.

4. The process of claim 3 wherein said metal is copper.

5. The process of claim 4 wherein said adhersion layer is composed of 30% titanium and 70% wolfram.

6. The process of claim 3 wherein said metal is gold.

7. The process of claim 1 wherein deposition of metal occurs by electroless plating.

8. The process of claim 7 wherein said metal is copper.

9. The process of claim 7 wherein said metal is gold.

10. The process of claim 1 further comprising the further step of exposing the surface to an etchant prior to deposition of the metal in step (d).

11. The process of claim 10 wherein the etchant contains hydrogen fluoride.

12. A process for preparation of a seed layer for selective metal deposition which comprises:
    a. coating a substrate with at least two layers of material, an electrical insulating surface layer and at least one subsurface metal layer,
    b. exposing said layers to a laser beam of sufficient energy to cause melting and intermixing of said layers in locations where surface activation is desired, thereby activating said surface layer,
    c. cooling and solidifying said intermixed layers, and
    d. depositing metal on said activated surface layer.

13. The process of claim 12 wherein said substrate is a silicon circuit board.

14. The process of claim 12 wherein said subsurface layer is gold.

15. The process of claim 12 wherein said surface layer is silicon.

16. The process of claim 12 wherein an adhesion layer is interposed between said substrate and said metal layer.

17. The process of claim 12 wherein said laser is an argon ion laser.

* * * * *